United States Patent
Chou et al.

(10) Patent No.: US 9,281,819 B2
(45) Date of Patent: Mar. 8, 2016

(54) SOURCE DRIVING CIRCUIT AND RESISTOR RENORMALIZATION METHOD

(71) Applicant: Raydium Semiconductor Corporation, Hsinchu (TW)

(72) Inventors: Kuan-Hung Chou, Kaohsiung (TW); Yu-Chun Tsai, Hsinchu (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 14/689,581

(22) Filed: Apr. 17, 2015

(65) Prior Publication Data

US 2015/0311896 A1    Oct. 29, 2015

(30) Foreign Application Priority Data

Apr. 24, 2014   (TW) .............................. 103114881 A

(51) Int. Cl.
*H03B 1/00*   (2006.01)
*H03K 19/0175*   (2006.01)
*G09G 3/20*   (2006.01)

(52) U.S. Cl.
CPC ...... *H03K 19/017509* (2013.01); *G09G 3/2003* (2013.01); *G09G 2320/0233* (2013.01)

(58) Field of Classification Search
CPC ................... H03K 19/017509; G09G 3/2003; G09G 2320/0233

USPC ............ 327/108–112, 427, 434, 437; 326/82, 326/83, 87; 345/690
See application file for complete search history.

(56) References Cited

U.S. PATENT DOCUMENTS

2013/0307589 A1* 11/2013 Danklefsen .... H03K 19/017545
                                                                    327/108
2014/0035630 A1*  2/2014 O'Donnell .............. H01L 25/16
                                                                    327/109

* cited by examiner

*Primary Examiner* — Lincoln Donovan
*Assistant Examiner* — Thomas Skibinski

(57) ABSTRACT

A resistor renormalization method for a source driving circuit is provided, wherein the source driving circuit includes a plurality of resistors coupled in series, and the resistors respectively have a resistance and correspond to a number section value. The resistor renormalization method includes the steps of: (A) adding the resistances of the resistors to generate a total resistance; (B) providing a radix, wherein the radix is a natural number; (C) dividing the total resistance by the radix to generate a calculated section value; (D) dividing the resistances of the resistors by the radix to generate a plurality of remainders, respectively, and adding the remainders to generate an accumulated remainder; and (E) setting the number section value and the resistance of each resistor according to a relation between the calculated section value and the number section value and a relation between the remainder of each resistor and the radix.

10 Claims, 4 Drawing Sheets

| L255 | L254 | | L253 | | L252 | |
|---|---|---|---|---|---|---|
| 10A | 10B1 | 10C1 | 10C2 | 10D1 | 10E1 | 10E2 |
| 4Ω | 4Ω | 4Ω | 4Ω | 4Ω | 4Ω | 4Ω |
| R=0 | R=0 | R=0 | R=0 | R=0 | R=0 | R=0 |

SOURCE DRIVING CIRCUIT AND RESISTOR RENORMALIZATION METHOD

BACKGROUND OF THE INVENTION

1. Field of the Invention

The present invention relates to a source driving circuit and a resistor renormalization method thereof, in particular, to a source driving circuit and a resistor renormalization method thereof capable of reducing cost and correction errors.

2. Description of the Prior Art

In the source driving circuit architecture of a conventional display, it generally uses a long string of resistors to control the gamma voltage level. In practice, the resistance assigned by the gray-scale voltage of the source driving circuit provided by the manufacturer may have many combinations. In other words, when the source driving circuit drives a display device, an incorrect gamma resistance may be produced, resulting in poor image display.

Some manufacturers try to use a plurality of switches, a first stage selector, a second stage selector and a voltage divider circuit to improve the image display produced by the gray-scale voltage. However, the above-mentioned switch elements will increase additional cost and power consumption. In addition, in order to adjust the gamma curve of display data, some display devices use a large amount of register space, but still unable to reduce cost.

In addition, in order to obtain a better resistance distribution, some manufacturers try to improve the resistance setting of the source driving circuit and directly adjust the gamma resistance of the circuit. However, in the process of adjusting the resistance setting, it is difficult to design a suitable algorithm, and therefore still cannot solve the above problems effectively.

SUMMARY OF THE INVENTION

In view of the above problems of the prior art, the present invention provides a source driving circuit and a resistor renormalization method thereof capable of reducing cost and improving the gamma curve effectively.

In another aspect, the present invention provides a resistor renormalization method with an improved algorithm to reset the resistance.

In one aspect, the present invention provides a source driving circuit using a computing module to achieve the effect of proper resistance distribution.

One object of the present invention is to provide a resistor renormalization method for a source driving circuit, wherein the source driving circuit includes a plurality of resistors coupled in series, and the resistors respectively have a resistance and correspond to a number section value Y. The resistor renormalization method includes the steps of: (A) adding the resistances of the resistors to generate a total resistance; (B) providing a radix N, wherein the radix N is a natural number; (C) dividing the total resistance by the radix N to generate a calculated section value X; (D) dividing the resistances of the resistors by the radix N to generate a plurality of remainders R, respectively, and adding the remainders R to generate an accumulated remainder P; and (E) setting the number section value Y and the resistance of each resistor according to a relation between the calculated section value X and the number section value Y and a relation between the remainder R of each resistor and the radix N.

Another object of the present invention is to provide a source driving circuit, the source driving circuit includes a plurality of resistors and a computing module. The resistors are coupled in series and correspond to a number section value Y, wherein the resistors respectively have a resistance. The computing module has a radix N; the computing module adds the resistances of the resistors to generate a total resistance, wherein the computing module divides the total resistance by the radix N to generate a calculated section value X and the radix N is a natural number. The computing module divides the resistances of the resistors by the radix N to generate a plurality of remainders R and adds the remainders R to generate an accumulated remainder P. The computing module sets the number section value Y and the resistance of each resistor according to a relation between the calculated section value X and the number section value Y and a relation between the remainder R and the radix N.

Compared to the prior arts, the source driving circuit and the resistor renormalization method of the present invention use the computing module to adjust the resistances of the resistors by executing the algorithm, so that the accuracy of the gamma voltage can be enhanced and the cost can be reduced effectively. In practice, the resistor renormalization method of the present invention adjusts the resistances between the gray-scale contacts according to the remainder of each resistance; therefore, it is possible to reduce additional cost and effectively provide the correct gamma curve.

The advantages and spirit of the present invention may be understood by the following detailed description and the accompanying drawings.

DETAILED DESCRIPTION OF THE PREFERRED EMBODIMENT

According to a preferred embodiment of the present invention, the present invention provides a resistor renormalization method for a source driving circuit, for adjusting the desired resistance of the gamma voltage. Specifically, the present invention is related to a resistor renormalization method, which can effectively provide a correct gamma curve by an algorithm to recalculate the resistor setting value corresponding to the gamma voltage.

Figure 1:
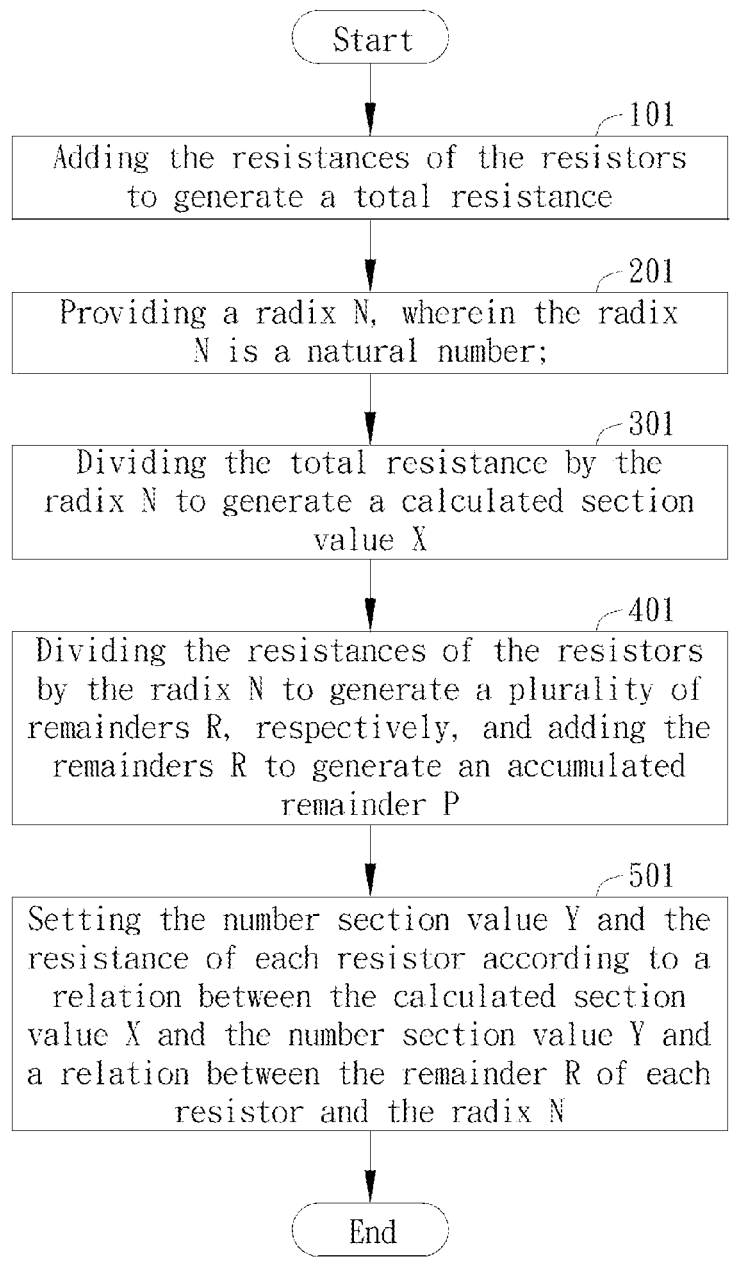
FIG. 1 shows a flowchart of the resistor renormalization method according to the present invention.
Figure 2:
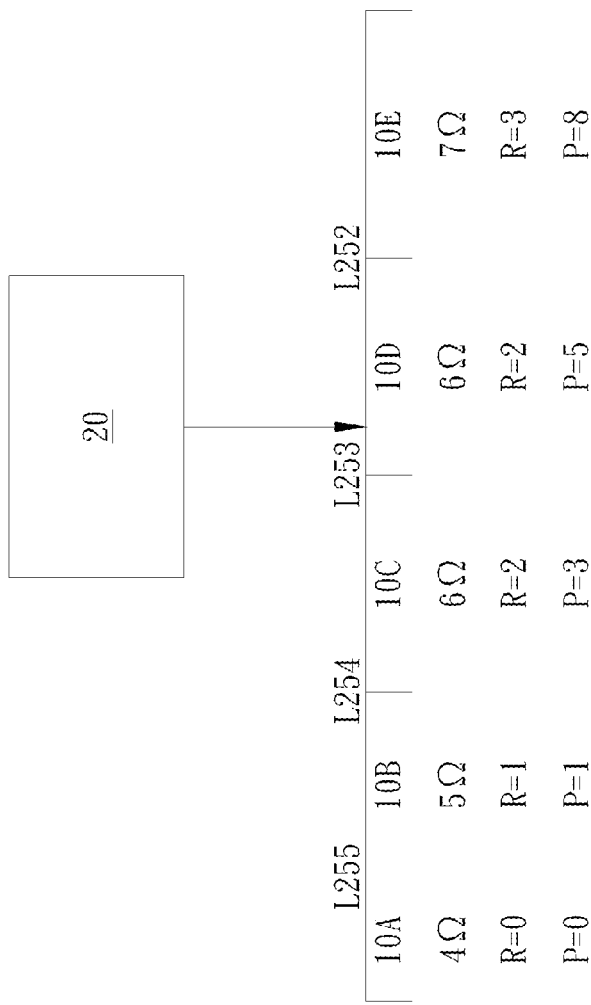
FIG. 2 schematically illustrates a source driving circuit according to an embodiment of the present invention.

Referring to FIG. 1 and FIG. 2, FIG. 1 shows a flowchart of the resistor renormalization method according to the present invention, and FIG. 2 schematically illustrates a source driving circuit according to an embodiment of the present invention.

As shown in FIG. 2, the source driving circuit includes a plurality of resistors 10A, 10B, 10C, 10D and 10E coupled in series and a computing module 20. The resistors 10A, 10B, 10C, 10D and 10E respectively have a resistance and correspond to a number section value Y. It should be noted that the number section value Y is a number setting value of the resistors at the initial state. In this embodiment, the number section value Y is 5, i.e., a total of five resistors at the beginning.

In addition, a plurality of gray-scale contacts are disposed between the resistors, wherein the gray-scale contact L255 is disposed between the resistors 10A and 10 ft the gray-scale contact L254 is disposed between the resistors 10B and 10C, the gray-scale contact L253 is disposed between the resistors 10C and 10D, and the gray-scale contact L252 is disposed between the resistors 10D and 10E.

In this embodiment, the resistors are coupled in series with each other and respectively have a resistance. The resistance of the resistor 10A is 4 ohm, the resistance of the resistor 10B is 5 ohm, the resistance of the resistor 10C is 6 ohm, the resistance of the resistor 10D is 6 ohm, and the resistance of the resistor 10E is 7 ohm, but is not limited thereto. It should be noted that the resistance of these resistors are stored in the source driving circuit in digital form, and the method of the present invention is to readjust the resistances through the algorithm stored in the computing module, thereby improve the gamma curve. Precisely, the method of the present invention is to change the resistance between the gray-scale contacts, thereby achieve the effect of adjusting the display effect.

As shown in FIG. 1, the resistor renormalization method includes the step 101 of adding the resistances of the resistors to generate a total resistance. As shown in FIG. 2, the computing module 20 adds the resistances of the resistors to generate a total resistance, wherein the total resistance of the resistors 10A-10E is 28.

In addition, the resistor renormalization method further includes the step 201 of providing a radix N, wherein the radix N is a natural number. Preferably, in an embodiment, the radix N is an integer approximate to an average of the resistances of the resistors; in another embodiment, the radix N can be an integer not greater than the minimum resistance of the resistors. In this embodiment, the computing module 20 has a radix N and the radix N is 4, but is not limited thereto. In other embodiments, the radix N may be 3 or other values according to the actual needs.

As shown in FIG. 1, the resistor renormalization method further includes the step 301 of dividing the total resistance by the radix N to generate a calculated section value X. As shown in FIG. 2, the computing module 20 divides the total resistance (=28) by the radix N (=4) to generate the calculated section value X, and therefore the calculated section value X is 7. It should be noted that the purpose of the resistor renormalization method is to renormalize the resistors originally set to Y sections to the resistors set to X sections, and the resistance of each resistor will be the same as the radix N after adjustment.

In this embodiment, the resistor renormalization method further includes the step 401 of dividing the resistances of the resistors by the radix N to generate a plurality of remainders R, respectively, and adding the remainders R to generate an accumulated remainder P. For example, as shown in FIG. 2, the computing module 20 divides the resistance of each of the resistors by the radix N to generate a plurality of remainders R, and adds the remainders R to generate the accumulated remainder P. The resistance of the resistor 10A is 4 ohm, so the remainder R is zero; the resistance of the resistor 10B is 5 ohm, so the remainder R is 1; the resistance of the resistor 10C is 6 ohm, so the remainder R is 2; the resistance of the resistor 10D is 6 ohm, so the remainder R is 2; and the resistance of the resistor 10E is 7 ohm, so the remainder R is 3. It should be noted that the accumulated remainders P of the resistors 10A-10E are 0, 1, 3, 5 and 8, respectively.

In addition, the resistor renormalization method further includes the step 501 of setting the number section value Y and the resistance of each resistor according to a relation between the calculated section value X and the number section value Y and a relation between the remainder R of each resistor and the radix N. In the real situation, the number section value Y and the calculated section value X may be the same or different. However, according to the method of the present invention, it will eventually make the calculated section value X and the number section value Y are the same, and make the resistance of each resistor and the radix N are the same.

As shown in FIG. 2, in this embodiment, the computing module 20 sets the number section value Y and the resistance of each resistor according to a relation between the calculated section value X and the number section value Y and a relation between the remainder R of each resistor and the radix N.

Figure 3:
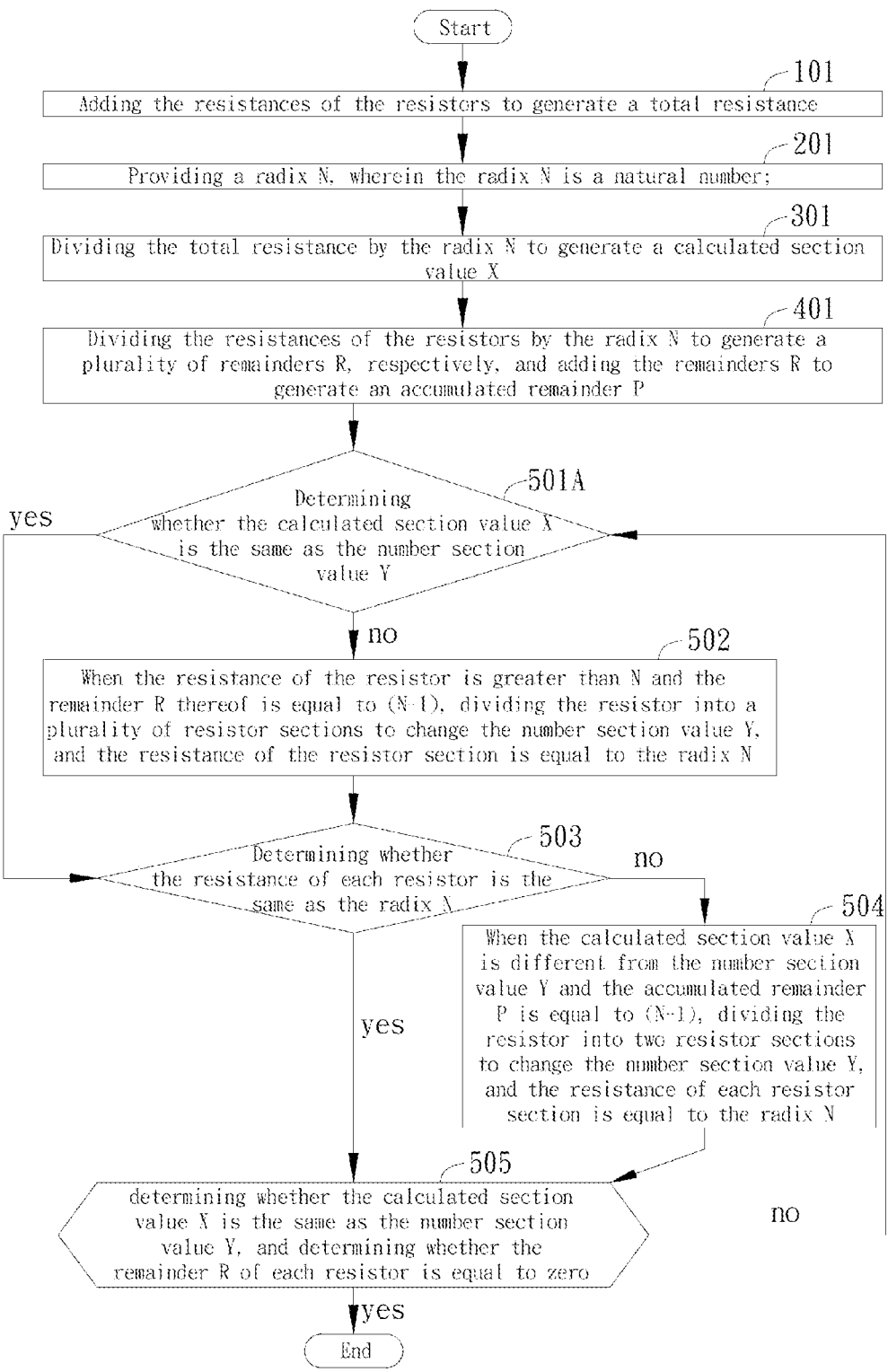
FIG. 3 shows another flowchart of the resistor renormalization method according to the present invention.

Referring to FIG. 3, which is another flowchart of the resistor renormalization method according to the present invention. As shown in FIG. 3, the resistor renormalization method includes the step 501A of determining whether the calculated section value X is the same as the number section value Y. For example, in the embodiment shown in FIG. 2, the computing module 20 determines the calculated section value X is different from the number section value Y since the calculated section value X is 7 and the number section value Y is 5.

In addition, as shown in FIG. 3, when the calculated section value X is different from the number section value Y, the resistor renormalization method further includes the step 502 of when the resistance of the resistor is greater than the radix N and the remainder R thereof is equal to (N−1), dividing the resistor into a plurality of resistor sections to change the number section value Y, and the resistance of the resistor section is equal to the radix N. For example, as shown in FIG. 2, the computing module 20 determines the calculated section value X is 7 and the number section value Y is 5, wherein the calculated section value X is different from the number section value Y. In addition, the resistances of the resistors 10B, 10C, 10D and 10E are 5 ohm, 6 ohm, 6 ohm and 7 ohm, respectively, and greater than the radix N(=4).

Figures 4, 5:
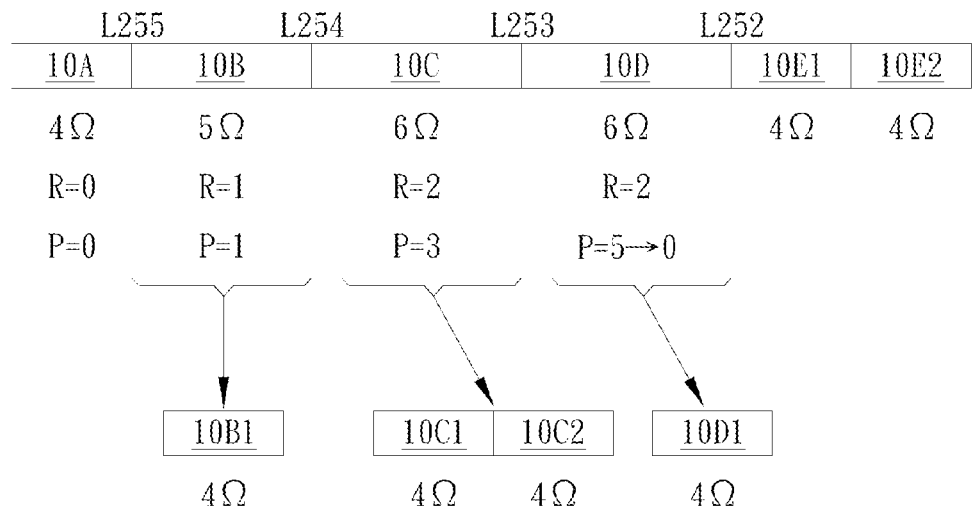
FIG. 4 schematically illustrates the resistors to be renormalized according to an embodiment of the present invention.
FIG. 5 schematically illustrates the resistors after renormalization according to an embodiment of the present invention.

It should be noted, in this step, when the resistance is greater than the radix N, the method will give priority to the resistor with remainder equal to (N−1). As shown in FIG. 2, the computing module 20 will give priority to the resistor 10E. Referring to FIG. 4, which schematically illustrates the resistors to be renormalized according to an embodiment of the present invention. As shown in FIG. 4, the resistor sections 10E1 and 10E2 are the resistor 10E shown in FIG. 2. In this embodiment, the computing module 20 divides the resistor 10E into two resistor sections 10E1 and 10E2. It should be noted that the resistances of the resistor sections 10E1 and 10E2 are 4 ohm and are the same as the radix N.

In addition, as shown in FIG. 3, after the step 502, the resistor renormalization method further includes the step 503 of determining whether the resistance of each resistor is the same as the radix N. Referring to FIG. 4, the computing module 20 determines the resistances of the resistors 10B, 10C and 10D are different from the radix N, and then the method executes the step 504. The step 504 includes when the calculated section value X is different from the number section value Y and the accumulated remainder P is equal to (N−1), divide the resistor into two resistor sections to change the number section value Y, and the resistance of each resistor section is equal to the radix N. For example, as shown in FIG. 4, the remainder R of the resistor 10A is zero and the accumulated remainder P is zero, so the computing module 20 maintains the resistance of the resistor 10A in 4 ohm. In addition, the remainder R of the resistor 10B is 1, the accumulated remainder P is 1 and is not equal to N−1 (that is, 3), so the computing module 20 sets the resistance of the resistor 10B from 5 to 4. Then, the computing module 20 processes the resistor 10C, wherein the remainder R of the resistor 10C is 2 and the accumulated remainder P is N−1 (that is, 3). In addition, the computing module 20 divides the resistor 10C into two resistor sections 10C1 and 10C2, and the resistance of each resistor section is 4 ohm and is the same as the radix N.

It should be noted that, when the resistor 10C is adjusted from one resistor section into two resistor sections, this is the "carry". Once the "carry" is implemented, the accumulated remainder P will be zero.

In addition, the present method continues to step 504 for the resistor 10D. The remainder R of the resistor 10D is 2 and the accumulated remainder P is 2. Because of the accumulated remainder P of the resistor 10D did not equal to N−1 (that is, 3), so the computing module 20 adjusts the resistance of the resistor 10D to 4.

After the step 504, the present method executes the step 505 of determining whether the calculated section value X is the same as the number section value Y, and determining whether the remainder R of each resistor is equal to zero. Referring to FIG. 5, which schematically illustrates the resistors after renormalization according to an embodiment of the present invention. As shown in FIG. 5, the computing module 20 determines the resistances of the resistors 10A, 10B1, 10C1, 10C2, 10D1, 10E1 and 10E2 are 4 ohm, and the remainder R of each resistor is zero. Furthermore, in other embodiments, once the computing module 20 determines the calculated section value X is the same as the number section value Y, the computing module 20 adjusts the resistance of each resistor with the same radix. That is, the remainder of each resistor will be set to zero.

As shown in FIG. 5, compared to the resistors in FIG. 2, the resistors in FIG. 5 have the same resistance and the remainders thereof are all zero. In practice, this can effectively improve the gamma curve. Precisely, the resistor renormalization method of the present invention can process the remainder and readjust the resistance of each resistor by the algorithm, so as to have a suitable gamma resistance setting between the gray-scale contacts, and then to match different display devices.

Compared to the conventional technologies, the source driving circuit and the resistor renormalization method of the present invention use the computing module to adjust the resistances of the resistors by executing the algorithm, so that the accuracy of the gamma voltage can be enhanced and the cost can be reduced effectively. In practice, the resistor renormalization method of the present invention adjusts the resistances between the gray-scale contacts according to the remainder of each resistance, therefore, it is possible to reduce additional cost and effectively provide the correct gamma curve.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A resistor renormalization method for a source driving circuit, wherein the source driving circuit includes a plurality of resistors coupled in series, and the resistors respectively have a resistance and correspond to a number section value Y, comprising:
   (A) adding the resistances of the resistors to generate a total resistance;
   (B) providing a radix N, wherein the radix N is a natural number;
   (C) dividing the total resistance by the radix N to generate a calculated section value X;
   (D) dividing the resistances of the resistors by the radix N to generate a plurality of remainders R, respectively, and adding the remainders R to generate an accumulated remainder P; and
   (E) setting the number section value Y and the resistance of each resistor according to a relation between the calculated section value X and the number section value Y and a relation between the remainder R of each resistor and the radix N.

2. The resistor renormalization method of claim 1, wherein the step (E) comprises:
   (F1) determining whether the calculated section value X is the same as the number section value Y; and
   (F2) when the calculated section value X is different from the number section value Y, the resistance of the resistor is greater than N and the remainder R thereof is equal to (N−1), dividing the resistor into a plurality of resistor sections to change the number section value Y, and the resistance of one of the resistor sections is equal to the radix N.

3. The resistor renormalization method of claim 1, wherein the step (E) comprises:
   (G1) determining whether the calculated section value X is the same as the number section value Y; and
   (G2) when the calculated section value X is different from the number section value Y and the accumulated remainder P is equal to (N−1), dividing the resistor into two resistor sections to change the number section value Y, and the resistance of each resistor section is equal to the radix N.

4. The resistor renormalization method of claim 1, wherein the step (E) comprises:
   (H1) determining whether the calculated section value X is the same as the number section value Y; and
   (H2) adjusting the resistance of each resistor to be the same as the radix N when the calculated section value X is the same as the number section value Y.

5. The resistor renormalization method of claim 1, wherein the step (E) comprises:
   (I1) determining whether the calculated section value X is the same as the number section value Y; and
   (I2) adjusting the remainder R of each resistor to zero when the calculated section value X is the same as the number section value Y.

6. A source driving circuit, comprising:
   a plurality of resistors coupled in series and corresponding to a number section value Y, wherein the resistors respectively have a resistance; and
   a computing module having a radix N, the computing module adding the resistances of the resistors to generate a total resistance, wherein the computing module divides the total resistance by the radix N to generate a calculated section value X and the radix N is a natural number; the computing module divides the resistances of the resistors by the radix N to generate a plurality of remainders R and adds the remainders R to generate an accumulated remainder P; the computing module sets the number section value Y and the resistance of each resistor according to a relation between the calculated section value X and the number section value Y and a relation between the remainder R and the radix N.

7. The source driving circuit of claim 6, wherein when the calculated section value X is different from the number section value Y and the resistance of the resistor is greater than the radix N, the computing module divides the resistor into a plurality of resistor sections to change the number section value Y, and the resistance of one of the resistor sections is equal to the radix N.

8. The source driving circuit of claim 6, wherein when the calculated section value X is different from the number section value Y and the accumulated remainder P is equal to (N−1), the computing module divides the resistor into two resistor sections to change the number section value Y, and the resistance of each resistor section is equal to the radix N.

9. The source driving circuit of claim 6, wherein the computing module adjusts the resistance of each resistor to be the same as the radix N when the calculated section value X is the same as the number section value Y.

10. The source driving circuit of claim 6, wherein the computing module adjusts the remainder R of each resistor to zero when the computing section value X is the same as the number section value Y.

* * * * *